United States Patent [19]

Fukuta et al.

[11] Patent Number: 4,874,453
[45] Date of Patent: Oct. 17, 1989

[54] APPARATUS AND METHOD FOR PLASMA TREATMENT OF RESIN MATERIAL

[75] Inventors: Kenji Fukuta; Takaoki Kaneko; Yoshinobu Takahashi, all of Toyota, Japan

[73] Assignee: Toyota Jidosha Kabushiki Kaisha, Japan

[21] Appl. No.: 817,115

[22] Filed: Jan. 8, 1986

Related U.S. Application Data

[60] Division of Ser. No. 772,208, Sep. 5, 1985, Pat. No. 4,595,570, which is a continuation of Ser. No. 583,181, Feb. 24, 1985, abandoned.

[30] Foreign Application Priority Data

Feb. 25, 1983 [JP] Japan ................................. 58-29371
Feb. 25, 1983 [JP] Japan ................................. 58-29372
Mar. 10, 1983 [JP] Japan ................................. 58-38204

[51] Int. Cl.$^4$ .............................................. B01J 19/08
[52] U.S. Cl. ..................................... 156/345; 422/186; 422/186.05; 204/164; 118/723
[58] Field of Search ...................... 422/186.05, 186.06, 422/186.29, 186; 156/345, 643; 204/164; 427/38, 39, 40; 118/723, 50.1

[56] References Cited

U.S. PATENT DOCUMENTS

| 4,151,034 | 4/1979 | Yamamoto . | |
| 4,160,690 | 7/1979 | Shibagaki . | |
| 4,175,235 | 11/1979 | Niwa | 422/186.05 |
| 4,434,188 | 2/1984 | Kamo | 427/39 |
| 4,461,783 | 7/1984 | Yamazaki | 427/86 |
| 4,501,766 | 2/1985 | Suzuki | 427/38 |

FOREIGN PATENT DOCUMENTS

| 0046945 | 8/1981 | European Pat. Off. . | |
| 0090586 | 10/1983 | European Pat. Off. | 427/39 |
| 55-65436 | 5/1980 | Japan | 422/186.05 |
| 56-147832 | 11/1981 | Japan . | |
| 57-12032 | 1/1982 | Japan . | |
| 58-208326 | 12/1983 | Japan . | |

Primary Examiner—Richard Bueker
Attorney, Agent, or Firm—Finnegan, Henderson, Farabow, Garrett & Dunner

[57] ABSTRACT

An apparatus for plasma treatment, capable of plasma-treating works of resin material by irradiating the surfaces of the works with a microwave discharge plasma within a vacuum reaction chamber. A plasma introducing port is formed in the wall of the reaction chamber. A plasma-irradiating pipe is connected to the plasma introducing port for injecting the plasma into the reaction chamber to irradiate the surfaces of the works. A discharge port is formed in the wall of the reaction chamber to reduce the internal pressure of the reaction chamber. A plasma diffuser includes a rotatable vane for diffusing the flow of plasma to distribute uniform density of plasma in the reaction chamber. A plurality of deflecting plates projecting from the inner wall of the reaction chamber toward the interior thereof may also be provided to diffuse the flow of plasma in the reaction chamber. In a method, a plurality of the works are rotated in relation to each other about a common axis, and also individual works are rotated independently from each other about their own axes.

1 Claim, 21 Drawing Sheets

Fig. 29
Fig. 30
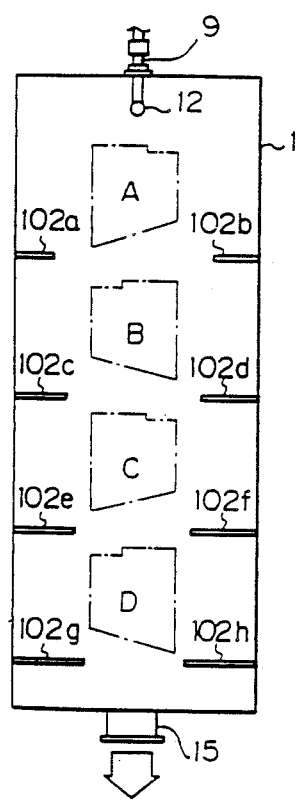
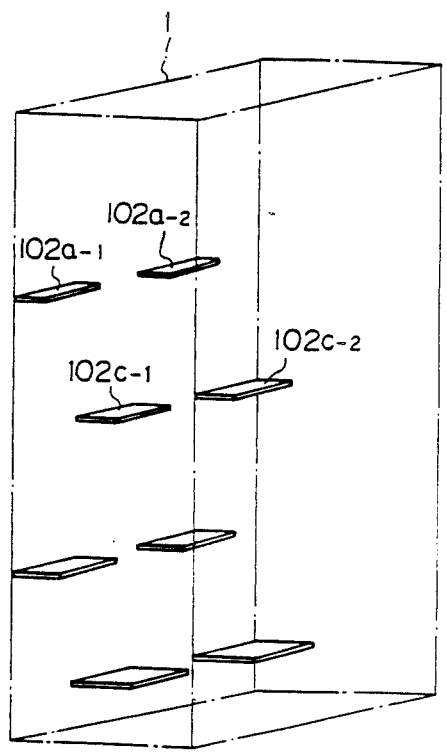

APPARATUS AND METHOD FOR PLASMA TREATMENT OF RESIN MATERIAL

This is a division of application Ser. No. 772,208, filed Sept. 5, 1985, now U.S. Pat. No. 4,595,570 which is a continuation of Ser. No. 583,381, filed Feb. 24, 1985 now abandoned.

FIELD OF THE INVENTION

This invention relates to an apparatus and method for the plasma treatment of the surfaces of work made of resin material, such as those made of polypropylene resin (PP) or polyethylene resin (PE), for reforming the surface thereof. And this invention is particularly effectively applicable to the surface pretreatment in painting comparatively large and complicated resin parts.

BACKGROUND OF THE INVENTION

It is a recent trend in industries, especially in the automobile industry, for instance, to use resin parts which are lightweight and superior in designing flexibility. However, the application of comparatively inexpensive PP or PE resin to exterior panels of vehicles, for instance, entails a problem that the adhesion of paint films to the surfaces of resin panels is not so good and the paint films are likely to peel off the surfaces. Treatment of surfaces with plasma has been known as a means for solving the above-mentioned problem. In plasma treatment, the surface of PP or PE resin parts are subjected to corona, or glow discharge treatment or to radio or microwave discharge treatment to oxidize (introduction of polar groups) or to etch (improvement of the anchoring effect) the surfaces.

On the other hand, in plasma treatment, it is necessary to evacuate or to reduce the pressure of the reaction chamber in order to enhance the effect of treatment (to extend the life of plasma). Accordingly, at the present a batch process is employed in most cases for plasma treatment.

In applying the batch system of plasma treatment process to the production of automotive parts, namely, to a mass production process, it is required that the reaction chamber is rapidly evacuated in a short period of time and the number of parts which can be subjected to plasma treatment in one batch cycle is increased. However, the conventional apparatus for plasma treatment has a problem that the parts are plasma-treated differently among the parts as well as within each part depending on the disposition of the parts in the reaction chamber, since automotive parts are large and complicated in configuration.

SUMMARY OF THE INVENTION

This invention is to provide a method and apparatus for plasma treatment, which method and apparatus are capable of solving the above-mentioned problems and of uniformly plasma-treating numerous comparatively large parts of complicated configuration at the same time.

Accordingly, it is a primary object of this invention to provide a method and an apparatus for plasma treatment, which method and apparatus are capable of estabilishing the uniform distribution of plasma density within a reaction chamber so that a plurality of parts placed in the reaction chamber are treated to the same extent regardless of the disposition and so that the individual parts are treated uniformly over the entire surfaces thereof regardless of the configuration thereof.

According to this invention, there is provided an apparatus for plasma treatment, capable of plasma-treating works of resin material by irradiating the surfaces of the works with a microwave discharge plasma within a vacuum reaction chamber, comprising a plasma introducing port formed in the wall of the reaction chamber, a plasma irradiating pipe connected to the plasma introducing port for injecting the plasma into the reaction chamber to irradiate the surfaces of the works, a discharge port formed in the wall of the reaction chamber to reduce the internal pressure of the reaction chamber, and a plasma diffuser including a rotatable vane for diffusing the flow of plasma to distribute uniform density of plasma in the reaction chamber.

Further, there is provided an apparatus for plasma treatment, capable of plasma-treating works of resin material by irradiating the surfaces of the works with a microwave discharge plasma within a vacuum reaction chamber, comprising a plasma introducing port formed in the wall of the reaction chamber, a plasma-irradiating pipe connected to the plasma introducing port for injecting the plasma into the reaction chamber to irradiate the surfaces of the works, a discharge port formed in the wall of the reaction chamber to reduce the internal pressure of the reaction chamber, and a plurality of deflecting plates projecting from the inner wall of the reaction chamber toward the interior thereof so as to diffuse the flow of plasma in the reaction chamber.

According to this invention, there is provided a method for applying surface plasma-treating to resin material placed in a reaction chamber by irradiating on works to be treated with a microwave discharge plasma, comprising rotating a plurality of said works in relation to each other about one or more common axis, as well as rotating said individual works independently from each other about their own axes.

BRIEF DESCRIPTION OF THE DRAWINGS

FIG. 29 is a schematic sectional view of another embodiment of a plasma treatment apparatus having deflecting plates;

FIG. 30 is a schematic view illustrating the arrangement of the deflecting plates in the apparatus of FIG. 29, (but only showing the deflecting plates on the one side of the reaction chamber);

DETAILED DESCRIPTION OF THE PREFERRED EMBODIMENTS

Before describing preferred embodiments of the present invention in detail, a comparable sample will be described hereunder.

Figure 1:
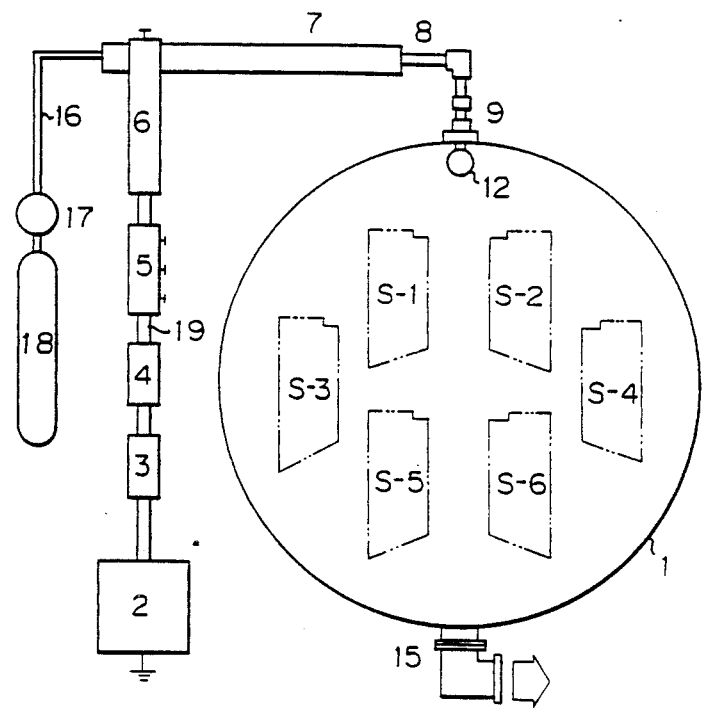
FIG. 1 is a schematic sectional view of a plasma treatment apparatus shown for comparison.

FIG. 1 is a schematic illustration of a microwave discharge plasma treatment apparatus of a comparable example. Resin parts used for motor vehicles were subjected to surface treatment in this plasma treatment apparatus. The degree of surface was not uniform, among the parts as well as among the positions within each part, due to the large size and the complicated configuration of those parts.

In FIG. 1, there are shown a reaction chamber 1, a microwave oscillator 2, an isolator 3 (Toshiba Corp.), a power monitor 4 (Toshiba Corp.), a three-stab tuner 5 (Toshiba Corp.), a plasma generating furnace 6, a plasma generating pipe 7, a quartz pipe 8, a plasma introducing port 9, a plasma-irradiating pipe 12, a discharge port 15 for evacuating the reaction chamber, a gas supply conduit 16, a flow meter 17, a gas bomb 18, a waveguide 19 and sample works S1 to S6.

Preparatory experiments were carried out in the following manner to acquire data for solving the above-mentioned problems residing in the microwave discharge plasma treatment apparatus of a comparable example in FIG. 1.

PROCEDURE OF THE PREPARATORY EXPERIMENTS (PP resin sample works)

[Reaction Chamber]

Cylindrical chamber: 2000 nm diameter × 2000 mm length

[Conditions of Treatment]

Frequency of microwave: 2450 MHz
Output capacity: 500 W
Degree of vacuum: 0.5 Torr
Working gas (flow rate): Oxygen gas (5000 cc/min)
Duration of treatment: 30 sec

[Plasma-Irradiating Pipe]

Figure 2:
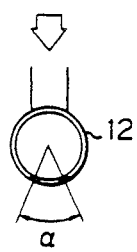
FIG. 2 is a schematic sectional view of the glass pipe of the apparatus of FIG. 1, as improved for preparatory experiments.
Figure 11:
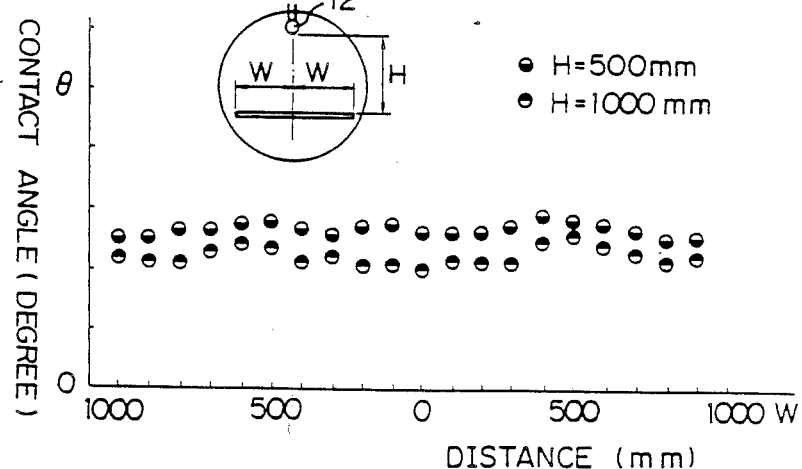
FIG. 11 is a graphical representation of the results of experimental plasma treatment according to the present invention.

Plasma injection angle α of the glass pipe 12: 0°, 30°, 60° (refer to FIGS. 2 and 11)

[Disposition of Sample Works]

Figure 3:
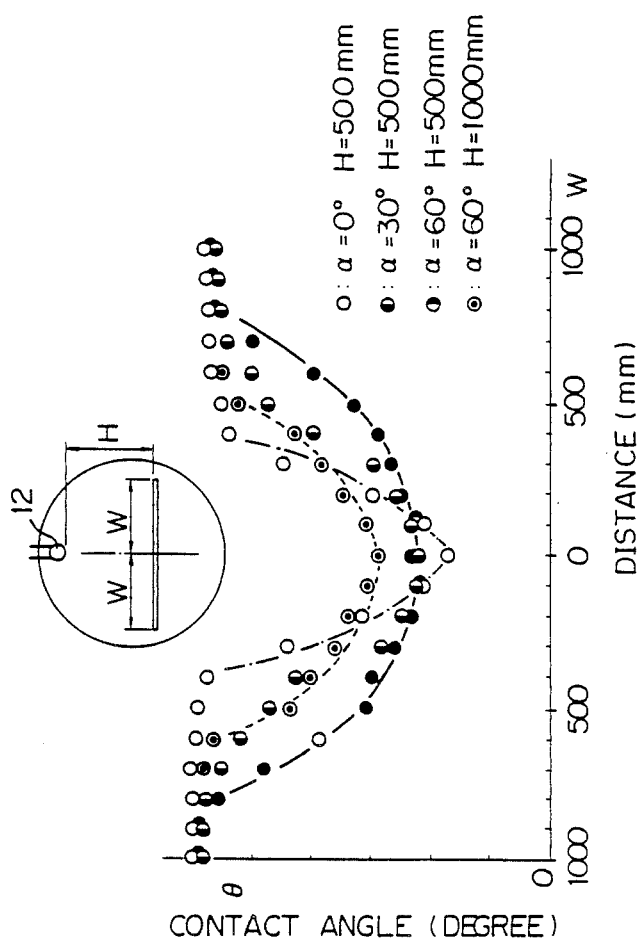
FIG. 3 is a graphical representation of the results of the preparatory experiments.

The sample works were so located that the distance H between the plasma injection nozzle made of the glass pipe 12 and the surfaces of the sample works, along the bisector of the angle α, was 500 mm or 1000 mm, as illustrated in FIG. 11. The contact angle of the plasma-treated surface of the sample works was measured, at positions on opposite sides and at a distance W (W=0 to 1000 mm), with respect to the point from the distance H of the intersection of the bisector of the plasma injection angle. Measured results are shown in FIG. 3.

[Contact Angle Measuring Method]

Demineralized water of 5 μl in quantity was dropped on the plasma-treated surface of the PP resin sample works. A contact angle measuring instrument (Kyowa Kagaku, Model: CA-A) was used for the measurement of the contact angle. The ambient air conditions were 20° C. and 50 to 60% RH.

The results of the preparatory experiments (FIG. 3) showed that:

(1) The life of the plasma introduced into the reaction chamber 1 is dependent on the distance between the plasma injection nozzle of the glass pipe 12 and the sample work; and (2) The diffusion of the plasma introduced into the reaction chamber 1 is dependent on the position (and/or angle α) of the plasma injection nozzle of the glass pipe 12.

Although not shown in FIG. 3, in addition to the facts explained in Paragraphs (1) and (2) described above, it was found that the plasma treatment was affected by the screening effect of the work affects. These are deemed to be attributable to the irregular distribution of the plasma density within the reaction chamber.

Figure 4:
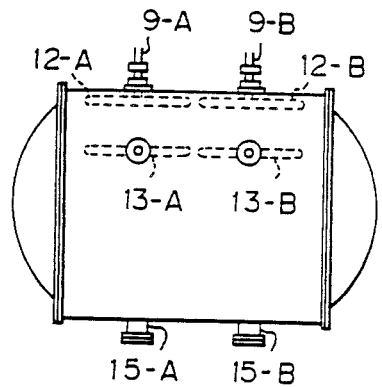
FIG. 4 is a side elevation of a first embodiment of a plasma treatment apparatus according to the present invention.
Figure 5:
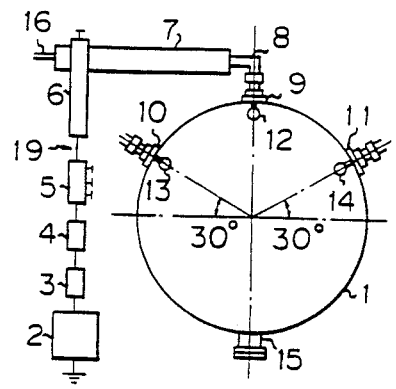
FIG. 5 is a schematic sectional view of the apparatus of FIG. 4.
Figure 8:
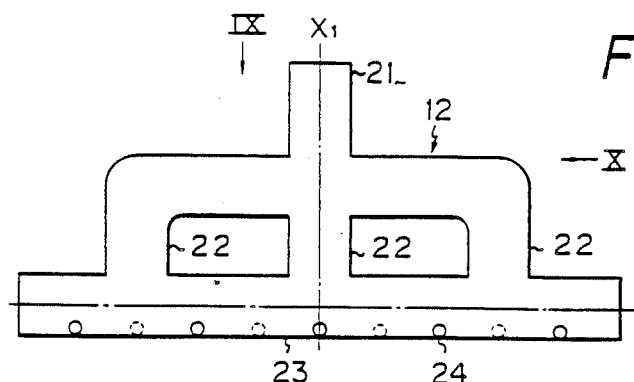
FIG. 8 is a front elevation of a glass pipe employed in the apparatus of the present invention.
Figure 9:
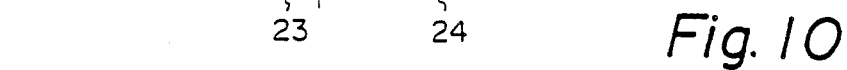
FIG. 9 is a view taken in the direction of the arrow IX in FIG. 8.
Figure 9:
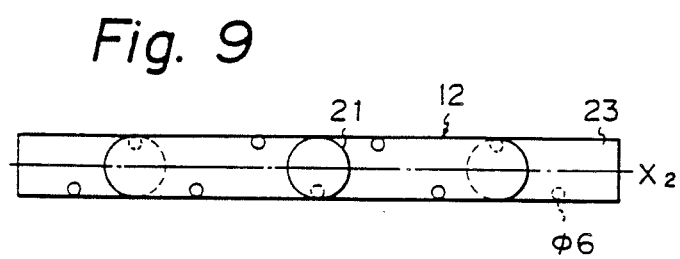
Figure 10:
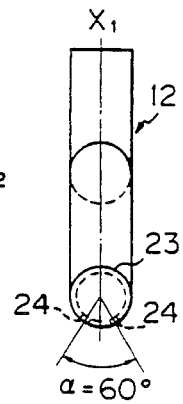
FIG. 10 is a view taken in the direction of the arrow X in FIG. 8.

FIGS. 4 and 5 illustrates a first embodiment of a plasma treatment apparatus according to the present invention. In this embodiment, the reaction chamber 1 is of a circular cylinder. Referring to FIGS. 4 and 5, there are shown a cylindrical reaction chamber 1 of 1000 mm or more in diameter, a microwave oscillator 2, an isolator 3 (Toshiba Corp.), a power monitor 4 (Toshiba Corp.), a three-stab tuner 5 (Toshiba Corp.), a plasma generating furnace 6, a plasma generating tube 7, a quartz tube 8, plasma introducing ports 9 (9-A, 9-B), 10 and 11, plasma-irradiating pipes 12 (12-A, 12-B), 13 (13-A, 13-B) and 14, exhaust ports 15 (15-A, 15-B) for evacuating the reaction chamber 1, a gas supply conduit 16 and a waveguide 19. The microwave generated by the oscillator 2 is guided through the isolator 3, the power monitor 4 and the three-stab tuner 5 to the plasma generating furnace 6 by the waveguide 19. On the other hand, a gas to be converted into a plasma is supplied through the conduit 16 to the plasma generating pipe 7. The plasma generated in the plasma generating pipe 7 and the plasma generating tube 7 is sent to the plasma introducing ports 9-A, 9-B, 10-A, 10-B, 11-A and 11-B. In the first embodiment, the three pairs of the plasma introducing ports 9, 10, and 11 are arranged on the three generatrices of the reaction chamber 1 which are separate from each other by an angular interval of 60° respectively. The plasma sent to the plasma introducing ports is injected into the reaction chamber 1 by the plasma-irradiating pipes 12-A, 12-B, 13-A, 13-B, 14-A and 14-B connected to the plasma introducing ports 9-A, 9-B, 10-A, 10-B, 11-A and 11-B respectively. The details of plasma injection nozzles formed in the plasma-irradiating pipes are illustrated in FIGS. 8 to 10. Since the reaction chamber 1 needs to be evacuated to a degree of vacuum of approximately 1.0 to 0.05 Torr for plasma treatment, the reaction chamber 1 is evacuated continuously by a vacuum pump, not shown, connected through pipes, not shown, to the exhaust ports 15.

Figure 6:
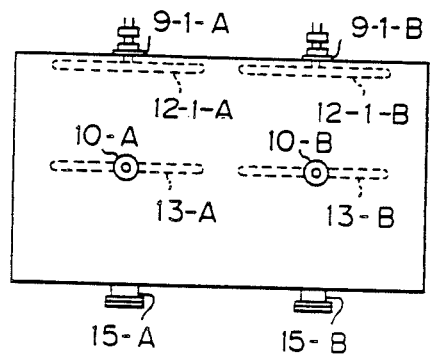
FIG. 6 is a side elevation of a second embodiment of a plasma treatment apparatus according to the present invention.
Figure 7:
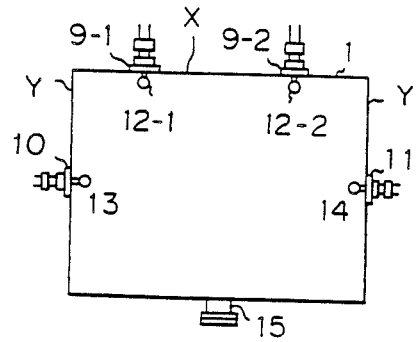
FIG. 7 is a schematic sectional view of the apparatus of FIG. 6.

FIGS. 6 and 7 show a second embodiment of a plasma treatment apparatus according to the present invention. In this embodiment, the reaction chamber 1 is formed in the form of a rectangular prism having sides each of 1000 mm or more in length. Same or corresponding parts are indicated by same or corresponding reference numerals through the first and the second embodiments. The size of the reaction chamber 1 in the form of a rectangular prism is, for example, that X indicated in FIG. 7 is 2500 mm which is the width of a wall provided with plasma introducing ports 9-1 and 9-2, Y also indicated in FIG. 7 is 1800 mm which is the width of walls provided with plasma introducing ports 10 and 11. A plurality of the plasma introducing ports 9-1 and 9-2 are arranged on the wall indicated by X as illustrated in FIG. 7, at an interval of 1000 mm or less, for example 900 mm. The other constitution and the functions of this second embodiment are the same as the first embodiment.

FIGS. 8 to 10 show plasma-irradiating pipes 12-, 13- and 14-A and B (first embodiment) or 12-1-, 12-2-A and B, 13-, 14-A and B (second embodiment) connected to the plasma introducing ports 9-, 10-, 11-A and B (first embodiment) or 9-1-, 9-2-A and B, 10-, 11-A and B (second embodiment) respectively. Desirably, the plasma-irradiating pipe 20 is formed of glass or quartz. The plasma-irradiating pipe 20 is joined at a base 21 thereof to the plasma introducing port (9, 10 or 11). A manifold 22 extends from the base 21 and a cylindrical spraying head 23 extends from the manifold 22. The spraying head 23 is formed so as to extend perpendicularly to and symmetrically with respect to the center axis $X_1$ of the corresponding plasma introducing port. The opposite ends of the spraying head 23 are closed. A plurality of plasma injection nozzles 24 of, for example, 6 mm in diameter are provided in the lower side of the spraying head 23 at fixed intervals along the longitudinal direction. The plasma injection nozzles 24 are staggered with respect to the center axis $X_2$ of the spraying head 23 as viewed in FIG. 9, so that the adjacent plasma injection nozzles are disposed on opposite sides of a plane defined by the center axes $X_1$ and $X_2$ as viewed in FIG. 10 and at an angular interval of 60° (at angular position of 30° on each side of the plane defined by the center axes $X_1$ and $X_2$).

FIG. 11 show measured results obtained by the experimental plasma treatment of works (PP resin works) by using the apparatus of the first embodiment (FIGS. 4 and 5) employing the plasma-irradiating pipes of FIGS. 8 to 10. In this experimental plasma treatment, the plasma-irradiating pipes were disposed so that the longitudinal axes of the plasma-irradiating pipes extend along the longitudinal axis of the cylindrical reaction chamber 1 as illustrated in FIG. 4. The size of the reaction chamber, the conditions of treatment and the contact angle measuring method are the same as those of the preparatory experiments. The distance H between the plasma injection nozzle and the surface of the sample works were 1000 mm and 500 mm (H is the dstance between the plasma-irradiating pipe 12 shown in FIG. 5 and the sample works). Contant angle was measured for the surface of the sample works within a range of W=0 to W=1000 mm (The definition of W in this experiment is the same as in the preparatory experiments). Other conditions of experiments were the same as the preparatory experiments mentioned before.

It is obvious from the results of the experiments as shown in FIG. 11 that the present invention is capable of establishing uniform distribution of plasma density within the reaction chamber, and capable of plasma-treating many comparatively large works of complicated configuration, simultaneously and uniformly, regardless of the location of the works, and also capable of eliminating irregular plasma treatment within each work attributable to the configuration.

Figure 12:
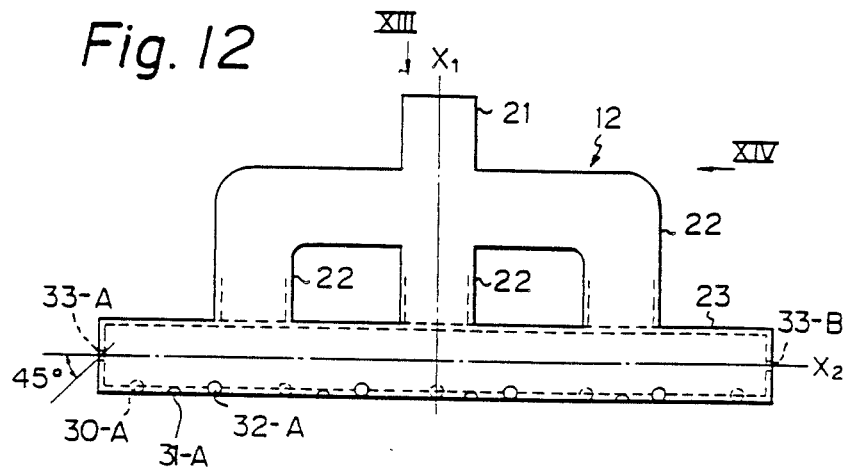
FIG. 12 is a front elevation of a glass pipe employed in a further embodiment of the present invention.
Figure 13:
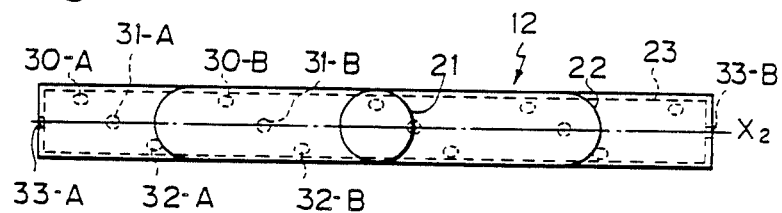
FIG. 13 is a view taken in the direction of the arrow XIII in FIG. 12.
Figure 14:
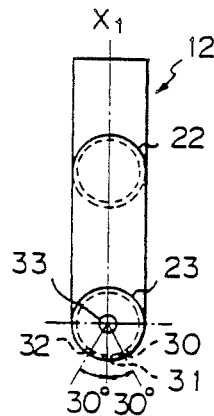
FIG. 14 is a view taken in the direction of the arrow XIV in FIG. 12.

FIGS. 12 to 14 show a second embodiment of a plasma-irradiating pipe according to the present invention. The plasma-irradiating pipe is joined coaxially at a base 21 to the plasma introducing port 9, 10 or 11 (FIGS. 4 and 5). A manifold 22 extends from the base 21 and a cylindrical spraying head ("plasma-irradiating pipe" in a narrow sense) 23 extends from the manifold 22. The plasma introducing ports 9, 10 and 11 are formed in the wall of the reaction chamber 1 as illustrated in FIGS. 4 and 5. The center axis $X_1$ of each plasma introducing port extends perpendicularly to the wall of the reaction chamber 1 (FIG. 4) and intersects the longitudinal center axis of the reaction chamber 1 (FIG. 5). The spraying head 23 is disposed in parallel to the longitudinal axis of the reaction chamber 1, with its center axis $X_2$ extending perpendicularly to the center axis $X_1$ of the corresponding plasma introducing port. The spraying head 23 extends for extends for equal lengths on both sides with respect to the center axis $X_1$ of the corresponding plasma introducing port. That is, the cylindrical spraying head 23 extends adjacently to and in parallel to the wall of the reaction chamber.

A plurality of plasma injecting nozzles 30 to 33 are formed in the cylindrical spraying head 23. The diameter of the plasma injection nozzle is, for example, 6 mm. The plasma injection nozzles 31-A, 31-B, . . . are formed in the bottom of the cylindrical spraying head 23 as viewed in FIG. 14 (in the portion of the cylindrical spraying head 23 extending farthest from the adjacent wall of the reaction chamber 1) along the longitudinal direction of the cylindrical spraying head 23 at a fixed interval (approximately 20 mm). The plasma injection nozzles 30-A, 30-B, . . . and the plasma injection nozzles 32-A, 32-B, . . . are disposed along the longitudinal direction of the spraying head 23 on opposite sides, respectively, of a place including the center axis $X_1$ and the plasma injection nozzles 31-A, 31-B, . . . and apart form the plasma injection nozzles 31-A, 31-B, . . . by an angular interval of 7.5° to 45°, preferably, 15° to 30°, for example 30°, at a fixed longitudinal interval as illustrated in FIGS. 13 and 14. It is desirable to dispose the plasma injection nozzles 30-A, 30-B, . . . , 31-A, 31-B, . . . and 32-A, 32-B, . . . so as to be staggered along the longitudinal direction of the spraying head 23 as illustrated in FIGS. 12 and 13.

Plasma injection nozzles 33-A and 33-B are formed in the opposite ends of the cylindrical spraying head 23 on the center axis $X_2$. The plasma injection nozzles 33-A and 33-B are declined as viewed in FIG. 12 at an angle between 15° to 80°, preferably 30° to 60°, for example, 45°, with respect to the center axis $X_2$, namely, toward the interior of the reaction chamber 1.

FIGS. 15 to 18 show the measured results of experiments performed to confirm the effect of the above-mentioned embodiments. The experiments were performed in the same manner as the experiments as described hereinbefore.

Figure 16:
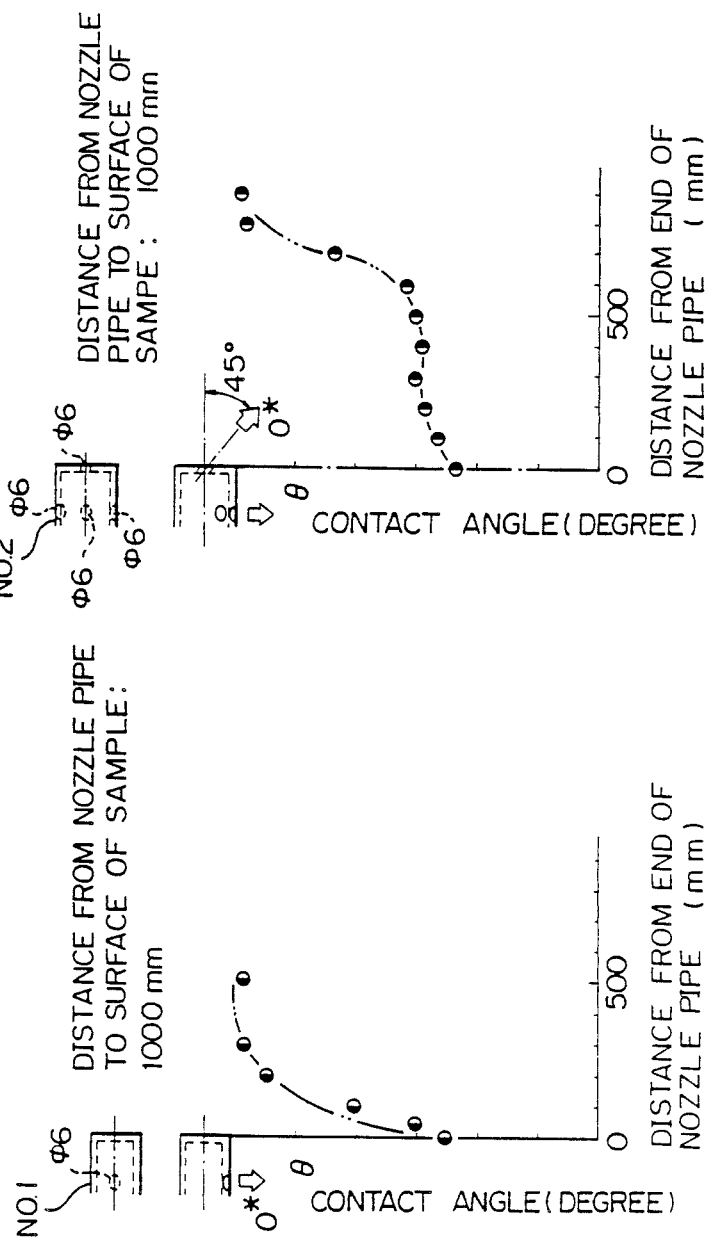
FIG. 16 is a graphical representation of the results of experiments carried out with a glass pipe embodying the present invention (a glass pipe provided with plasma radiating nozzles in the end walls)
Figure 15:
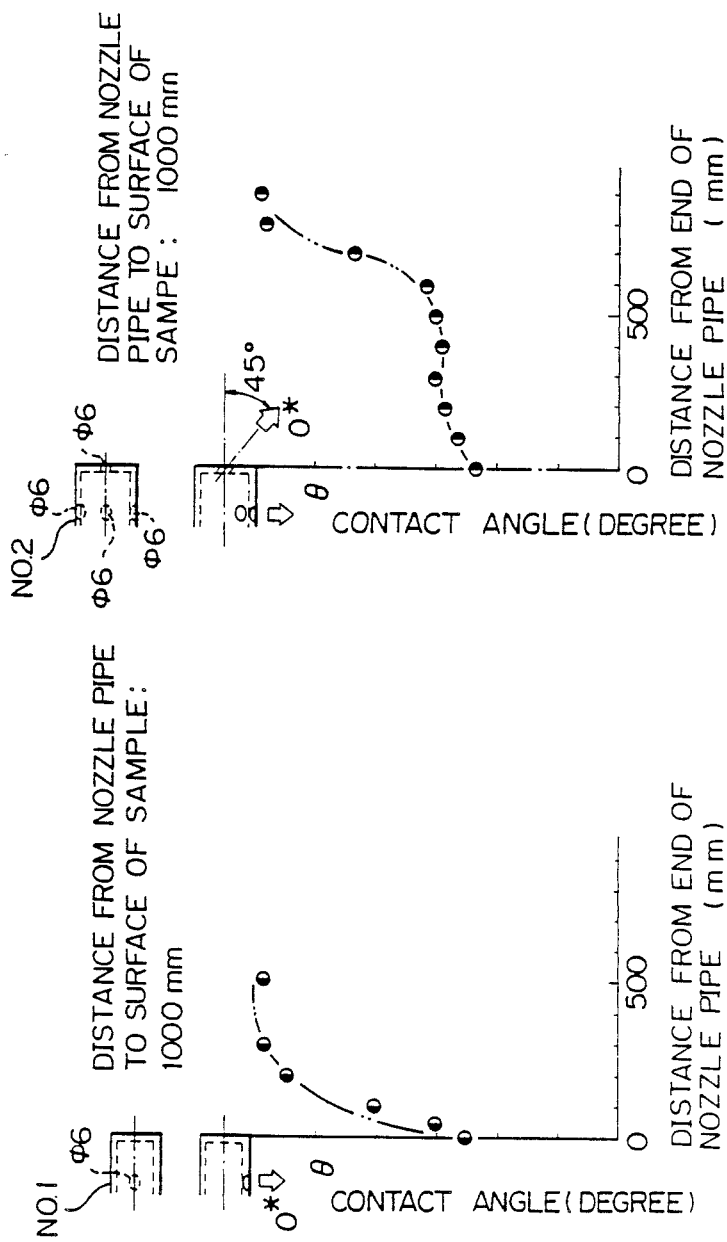
FIG. 15 is a graphical representation of the results of experiments carried out with a comparable glass pipe (a glass pipe provided with no plasma radiating nozzle in the end walls)

FIG. 15 shows experimental results of plasma treatment, in which the plasma-irradiating pipe (No. 1) having the plasma spraying head with no plasma injection nozzle in the end walls was employed for comparison. FIG. 16 shows the experimental results of plasma treatment, in which the above-mentioned embodiment of the plasma-irradiating pipe (No. 2) having the plasma spraying head provided with the plasma injection nozzles (33-A, 33-B) in the end walls thereof. In either experiment of plasma treatment, the work was placed 1000 mm away from and in parallel to the glass or nozzle pipe. In FIGS. 15 and 16, the abscissa represents the distance (mm) from the end of the glass or nozzle pipe to measuring points, while the ordinate represents measured contact angle. As is evident from the comparative examination of FIGS. 15 and 16, the provision of plasma injection nozzles in the end walls of the plasma spraying head uniformizes the distribution of plasma density within the reaction chamber.

Figure 17:
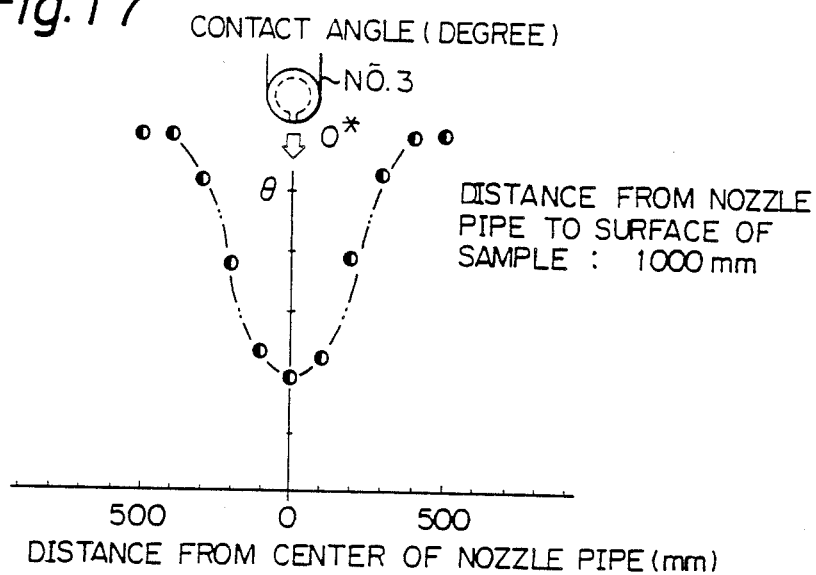
FIG. 17 is a graphical representation of the results of experiments carried out with a comparable glass pipe (a glass pipe provided only with plasma radiating nozzles 31)
Figure 18:
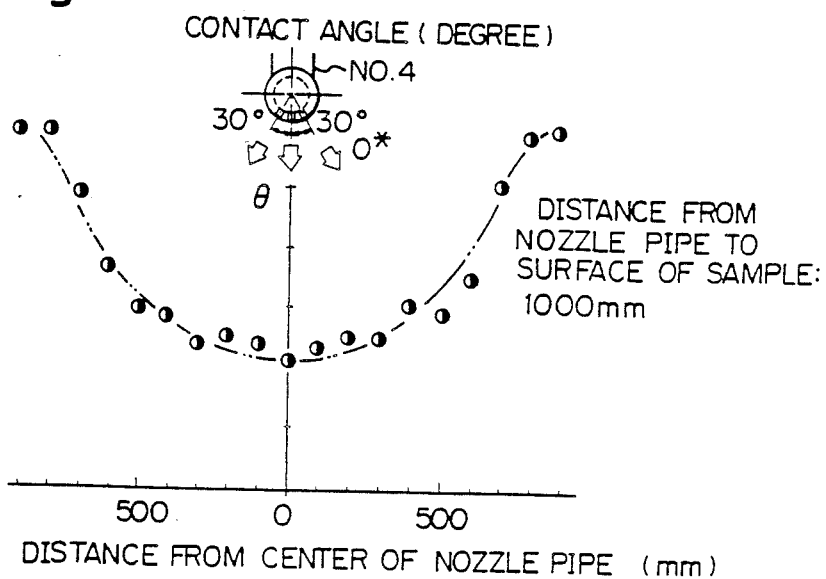
FIG. 18 is a graphical representation of the results of experiments carried out with a glass pipe embodying the present invention (a glass pipe provided with plasma radiating nozzles 30, 31 and 32)

FIG. 17 shows experimental rusults of plasma treatment, in which the plasma-irradiating pipe (No. 3) having the plasma injection nozzles 31 formed in the plasma spraying head within a plane including the center axes $X_1$ and $X_2$ (FIG. 14) was employed for comparison. FIG. 18 shows experimental results of plasma treatment, in which the above-mentioned plasma-irradiating pipe (No. 4) embodying the present invention, having the plasma injection nozzles 31 formed in a plane including the center axes $X_1$ and $X_2$ (FIG. 14) and plasma injection nozzles 30 and 32 formed in the same plasma spraying head outside the plane including the plasma injection nozzles 31. In either experiment of plasma treatment, the surface of a work was placed 1000 mm apart from the plasma-irradiating pipe, and contact angle was measured at measuring points on a line extending perpendicularly to the longitudinal direction of the plasma-irradiating pipe. In FIGS. 17 and 18, the abscissa represents the distance (mm) from the point of center 1000 mm apart from the plasma spraying head to the measuring point, while the ordinate represents measured contact angle. As is evident from the comparative examination of FIGS. 17 and 18, the provision of the plasma injection nozzles 30, 31, and 32 in an arrangement as illustrated in FIG. 14 uniformizes the distribution of plasma density within the reaction chamber.

Figure 19:
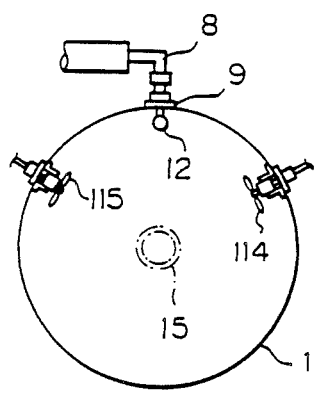
FIG. 19 is a schematic sectional view of a further embodiment of a plasma treatment apparatus according to this invention.
Figure 20:
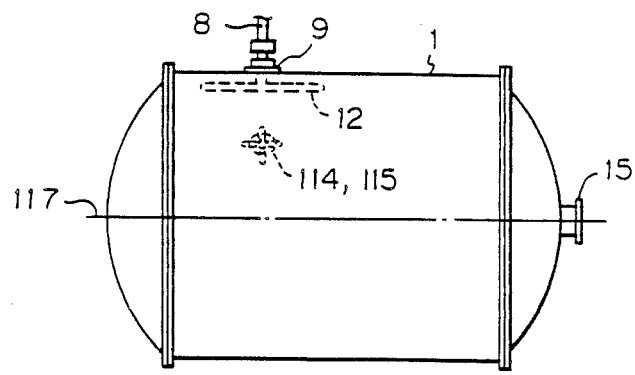
FIG. 20 is a schematic side elevational view of the embodiment shown in FIG. 19.

FIGS. 19 and 20 show a plasma treatment apparatus also embodying this invention, which comprises plasma diffusers 114 and 115 having vanes disposed on the inner wall of the reaction chamber 1 for improving the effects of diffusion of the plasma flow in the reaction chamber 1. The plasma introducing port 9 is provided in the left hand area of the cylindrical wall of the reaction chamber 1, while the discharge port 15 is provided on the center line 117 at the right end of the reaction chamber 1. The plasma diffuser 114 and 115 are provided at the same positions as the plasma introducing port 9 with regard to the longitudinal direction of the chamber 1, but separated by about 60° therefrom. The plasma radiating pipe 12 extends perpendicularly to the center axis of the plasma introducing port 9 and in the longitudinal direction of the reaction chamber 1.

Figure 21:
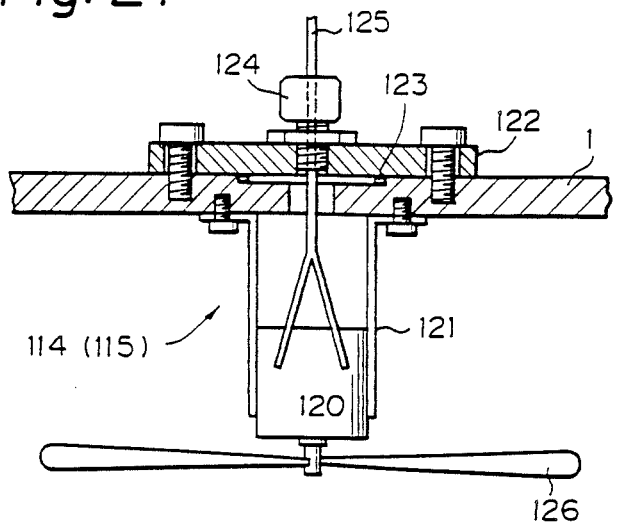
FIG. 21 is a sectional view of a plasma diffuser used in the embodiment shown in FIGS. 19 and 21.

FIG. 21 shows plasma diffusers 114 and 115 in detail. On the inner wall of the reaction chamber a vane 126 and a drive motor 120 therefor are mounted by a mounting member 121. A leading line 125 of the drive motor 120 is sealed by a connector 124 and a plate member 122 mounted on the outer wall of the chamber 1, the inside of which is maintained in the vacuum. On the other hand, the plate member 122 is sealed by an O-ring seal 123 with respect to the outer wall of the chamber 1. The motor 120 may also be provided on the outer wall of the chamber 1.

In this embodiment of plasma treatment apparatus according to this invention, the uniform distribution of the plasma density is established within the reaction chamber 1 by the fact that the plasma introduced into and radiated in the reaction chamber 1 is diffused in the longitudinal direction in the chamber by the plasma diffusers 114 and 115, then a flow of plasma toward the discharge port 15 is formed.

Figure 22:
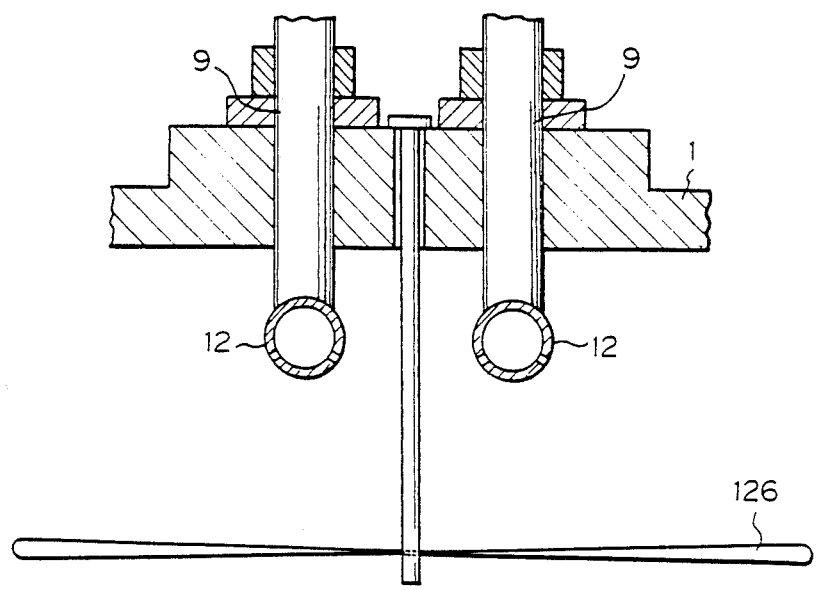
FIG. 22 is a sectional view of another type of plasma diffuser.

The plasma diffuser may also be constituted as shown in FIG. 22. Namely, a plasma diffusing vane 126 which is provided in the vicinity of plasma introducing ports 9 is rotated by virtue of the flow of plasma radiated from the plasma radiating pipe 12, in place of being rotated by a drive motor. The plasma diffusing vane 126 can also be provided in the vicinity of the discharge port 15, although not shown in the drawings, so as to rotate the plasma diffusing vane by virtue of the flow of discharge.

The positions, sizes, members and etc. of the plasma introducing port 9, discharge port, and plasma diffuser, and the revolutional speed of the plasma diffusing vane can be advantageously selected in view of the number, shapes, sizes and ets. of the works to be treated. Any combinations of these factors can be employed by a person skilled in the art without departing the spirit and seope of this invention.

Figure 26:
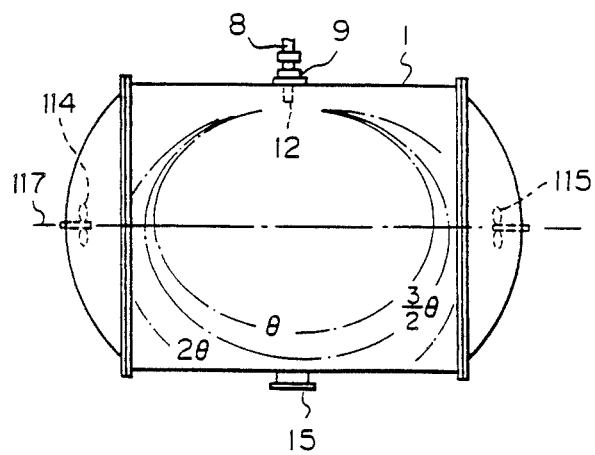
FIG. 26 is a schematic side elevational view of the embodiment shown in FIG. 25.

For example, in an embodiment shown in FIGS. 21 and 26, a plasma introducing port 9 is provided at the center on the cylindrical wall of the reaction chamber 1 (FIG. 26), a discharge port 15 is provided at the opposite position on the cylindrical wall, and plasma diffusers 114 and 115 are provided at the left and right ends, respectively, on the longitudinal center line of the reaction chamber 1.

Comparable experiments were carried out for the plasma treating apparatuses shown in FIGS. 23 through 26. The works used in the experiments were products consisting of polypropylene resin (PP).

In FIGS. 23 through 26, the effect of plasma treatment of the works at the various positions in th reaction chamber 1 are illustrated by lines indicating the distribution of contact angle ($\theta$). The conditions of treatment were as follows:

Frequency of microwave: 2450 MHz
Output capacity: 800 W
Degree of vacuum: 1.0 Torr
Duration of treatment: 30 sec
Working gas: Oxygen gas containing 10% nitrogen gas (1000 cc/min)

Figure 23:
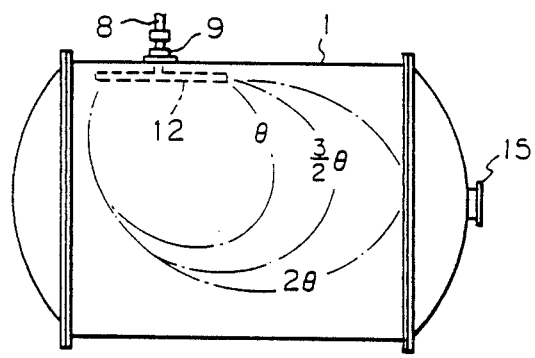
FIG. 23 is a schematic representation of the effects of plasma treatment using a plasma treatment apparatus as shown in FIGS. 19 and 20, but in case of the plasma diffusers being not actuated.
Figure 24:
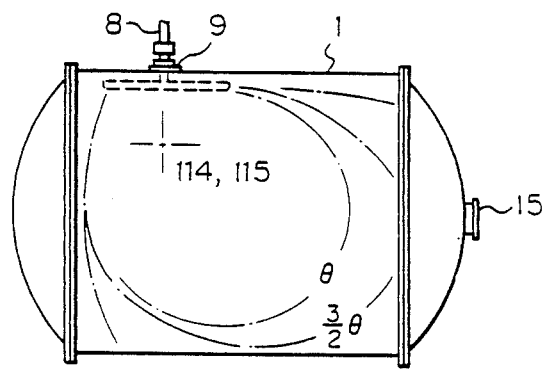
FIG. 24 is a schematic representation of the effects of plasma treatment using a plasma treatment apparatus as shown in FIGS. 19 and 20 in case of the plasma diffusers being actuated.

FIG. 23 shows the results of experiment using a plasma treatment apparatus as shown in FIGS. 19 and 20, but not actuating the plasma diffusing vanes. FIG. 24 shows the results of experiment using the same apparatus and actuating the plasma diffusing vanes at 20 to 60 RPM. As is evident from the comparative examination, it is understood that more wide and uniform distribution of the plasma density can be obtained and uniform plasma treatment over the entire surfaces of the works was attained regardless of the location and the configuration of the works in the case of FIG. 24 as compared to the case of FIG. 23.

Figure 25:
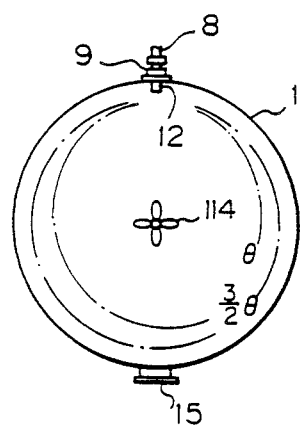
FIG. 25 is a schematic sectional view of another embodiment of plasma treatment apparatus having plasma diffusers and also represents the effects of plasma treatment thereof.

In the embodiment shown in FIGS. 25 and 26, an examination was carried out in the same conditions as in the case of FIG. 24, and effects of uniform plasma treatment was also attained as in the case of FIG. 24.

Figure 27:
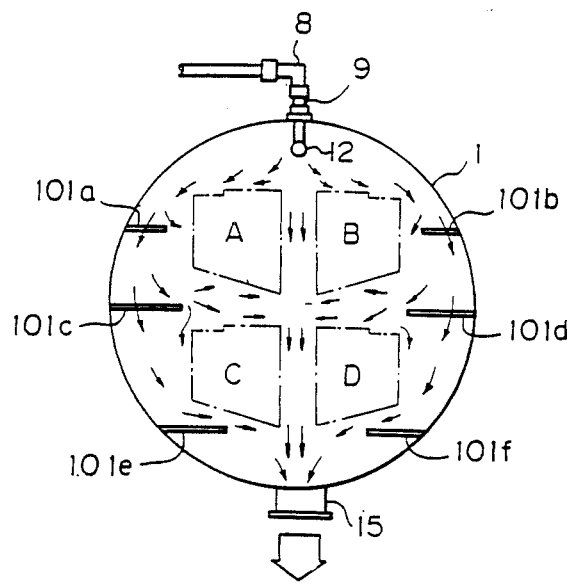
FIG. 27 is a schematic sectional view of an embodiment of a plasma treatment apparatus having deflecting plates according to this invention.
Figure 28:
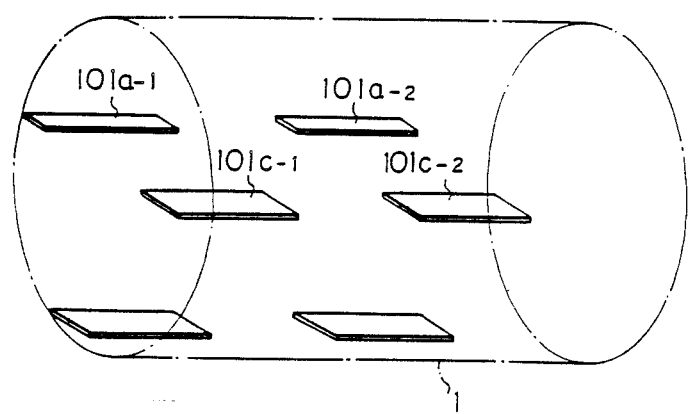
FIG. 28 is a schematic view illustrating the arrangement of the deflecting plates in the apparatus of FIG. 27, (but only showing the deflecting plates on the one side of the reaction chamber)

FIGS. 27 and 28 show a further embodiment of plasma treatment apparatus according to this invention, in which, deflecting plates 101 made of stainless steel, such as SUS, are arranged in the horizontal direction (in the direction perpendicular to the virtical direction of the works) and attached to the inner wall of the reaction chamber 1. The deflecting plates 101a, c and e are arranged in the left hand side, and deflecting plates 101b, d and f are arranged in the right hand side. The lengths of the deflecting plates 101a to 101f toward the works are larger in the downstream side of plasma than in the upstream side thereof. In the exbodiment shown in FIGS. 27 and 28, however, the most downstream side deflecting plates 101e and 101f have substantially the same length as the deflecting plate 101c and 101d, for avoiding the inside space of the reaction chamber 1 from reducing too much in view of the reaction chamber 1 being cylindrical shape. Regarding the axial direction of the cylindrical reaction chamber, the deflecting plates 101a-1, 101a-2, . . . in the same horizontal level have the same length and regularly spaced. These deflecting plates are arranged alternately with respect to the circumferential direction of the reaction chamber 1.

FIGS. 29 and 30 show another embodiment of plasma treatment apparatus having deflecting plates. The reaction chamber 1 is in the shape of a rectangular vertical column, in which a plurality of works A to D are arranged along the vertical direction. A plasma radiating pipe 12 is provided at the central position of an upper wall of the rectangular chamber 1, while a discharge port 15 is provided at the central position of a bottom wall of the chamber 1. A plurality of deflecting plates 102 made of stainless steel are arranged perpendicularly to the vertical direction of the rectangular chamber 1. The horizontal lengths of the deflecting plates toward the works are larger in the downstream side than in the upstream side. These deflecting plates are regularly spaced with respect to the horizontal direction along the inside wall, in the same as the previous embodiment shown in FIGS. 27 and 28, and arranged alternately with respect to the vertical direction.

Figure 31:
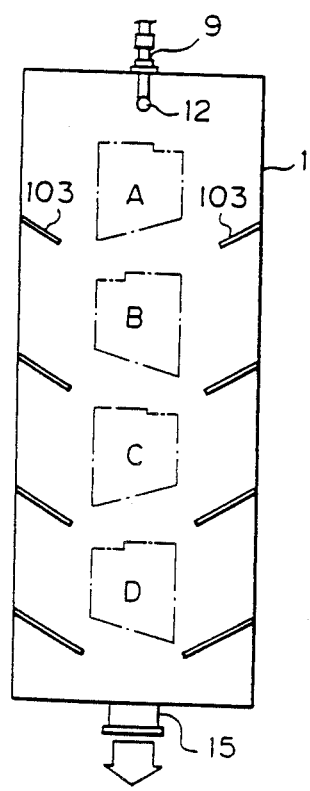
FIG. 31 is a schematic sectional view of a still another embodiment of a plasma treatment apparatus having deflecting vanes.

Although the deflecting plates are (horizontally) arranged perpendicularly to the vertical direction of the works in the embodiments shown in FIGS. 27 through 30, deflecting plates 103 may be inclined toward the downstream of the flow of plasma as an embodiment shown in FIG. 31. Otherwise, the deflecting plates can be constructed so that the angle thereof be changeable according to the sizes, shapes, numbers, and etc. of the works. In any case, the deflecting plates can be made of any material, such as stainless steel, for example SUS as mentioned above, which may cause the deactivation of the plasma and may not be affected by itself, when plasma gas is exposed thereon.

In these embodiments, a part of radiated plasma, after having been collided to the works, flows along the inside wall of the reaction chamber 1. The flow of plasma is, then, deflected toward the works A to D by the deflecting plates, as shown by arrows in FIG. 27, and spread to the various portions within the reaction chamber 1 so that the works are uniformly treated by plasma, which is then discharged through the discharge port 15 to the outside of the chamber 1.

In these embodiments of plasma treatment apparatus having deflecting plates, the uniform distribution of the plasma density is established within the reaction chamber 1 by the deflecting plates and even in the plasma treatment of comparatively large works of complicated configuration, uniform plasma treatment over the entire surfaces of the works is attained regardless of the location and configuration of the works. In addition, as these effects can be attained by these deflecting plates of simple construction, it is not necessary to increase the numbers of plasma radiating pipes, and the accompaying oscillators, wave-transmitting pipes, plasma generating pipes and etc.

Figure 32:
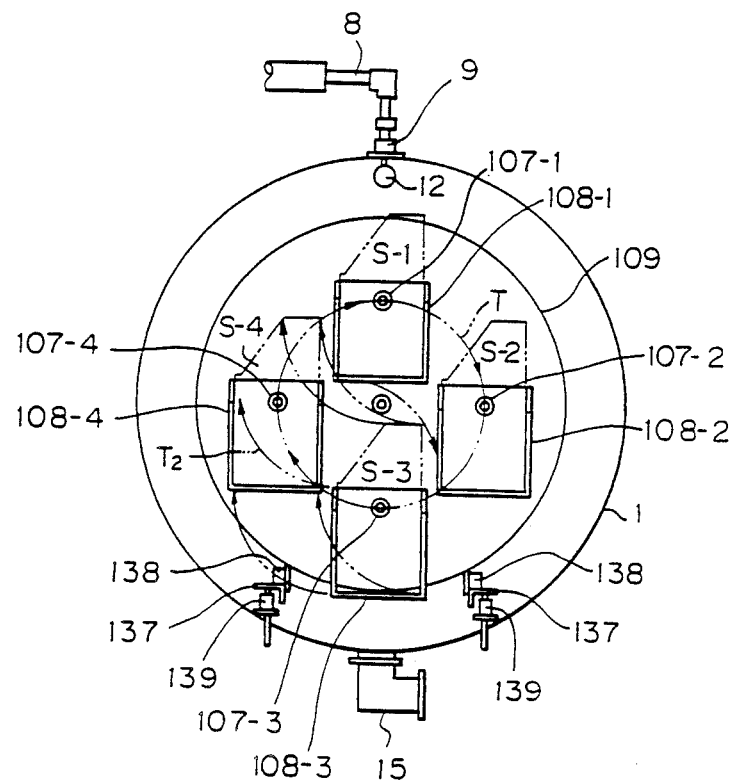
FIG. 32 is a transverse sectional view of a further embodiment of a plasma treatment apparatus according to this invention.
Figure 33:
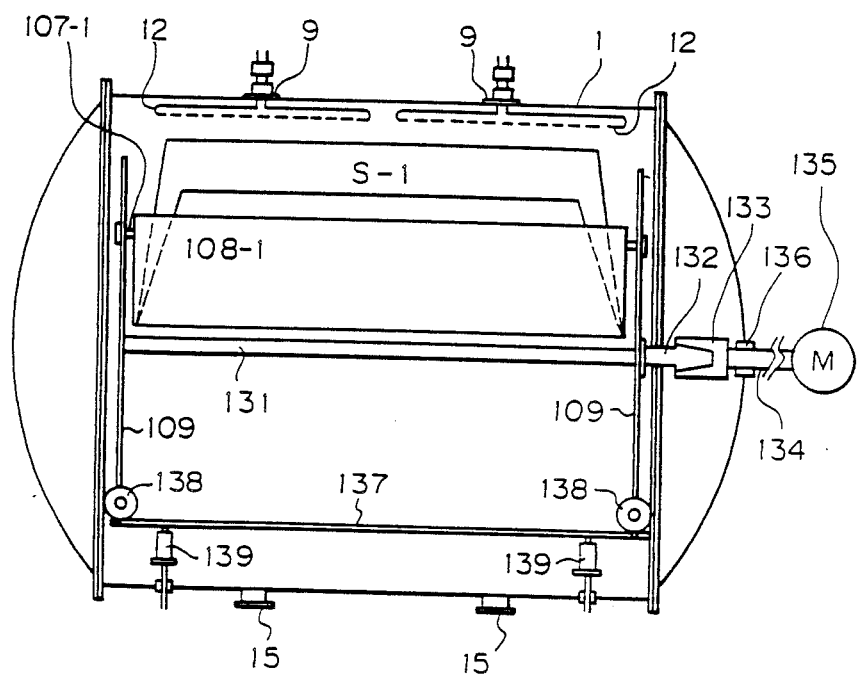
FIG. 33 is a longitudinal sectional view of the plasma treatment apparatus shown in FIG. 32.

An embodiment of plasma treatment apparatus shown in FIGS. 32 and 33 is so constructed as to treat four works S-1 to S-4 at the same time. The works S-1 to S-4 are supported on mounting members 108-1 to 108-4, respectively, which are connected to vertical disk plates 109 of a carriage through free rotatable shaft 107-1 to 107-4, respectively. The mounting members 108-1 to 108-4 are freely rotatable about the respective shafts 107-1 to 107-4.

In the illustrated plasma treatment apparatus, the vertical disk plates 109 are rigidly secured to a rotatable shaft 103 which passes through the centers of the disks 109. An extension 132 of the rotatable shaft 131 is connected by a connector 133 to a shaft 134 of a motor 135. The motor shaft 134 is seated by a vacuum seal 136 provided in the wall of the reaction chamber 1.

The rotatable shaft 131 is driven by the motor 135, and consequently the vertical disks 109 are rotated so that the shafts 107-1 to 107-4 for supporting the mounting members 108-1 to 108-4 are simultaneously moved along a circular trace $T_1$. During these movements, the orientations of the mounting members 108-1 to 108-4 as well as the works S-1 to S-4 are automatically adjusted through their turning around the free rotatable shafts 107-1 to 107-4, respectively.

In FIGS. 32 and 33, reference numeral 137 denotes rails for the carriage, and 138 denotes wheels of the carriage traveling on the rails 137. When the carriage is locked at a predetermined position, i.e., when the shaft extension 132 is connected with the connector 133, the rails 137 are lowered by air cylinders 139 to a position in which the rails 137 do not prevent the rotation of the vertical disk plates 109. The reaction chamber 1 is then closed by a door member and a series of plasma treatment operations is carried out in the reaction chamber 1.

Although only one rotatable shaft 131 is provided in the embodiment shown in FIGS. 32 and 33, two or more such rotatable shafts and the corresponding number of motors 135 can also be provided. In addition, if necessary, the motor 135 can be disposed in the inside of the reaction chamber 1.

Using a plasma treatment apparatus as shown in FIGS. 32 and 33, some samples of vehicle parts were treated under the same conditions as the above-mentioned comparable example as shown in FIG. 1. In this embodiment, the rotatable shaft 131 was rotated at 10 to 20 RPM. As a result, uniform distribution of the effects of the plasma treatment was obtained over the all sample works and over the entire surfaces of each work.

Therefore, according to this embodiment, the combination of freely rotating the works about themselves and moving all works along a circular trace makes it possible that uniform density of plasma be radiated on the entire surfaces of the works.

In addition, according to this embodiment, more uniform distribution of the plasma density can be obtained by the fact that the plasma in the reaction chamber 1 is advantageously stirred up by the rotational movement of the mounting members 108-1 to 108-4.

Figure 34:
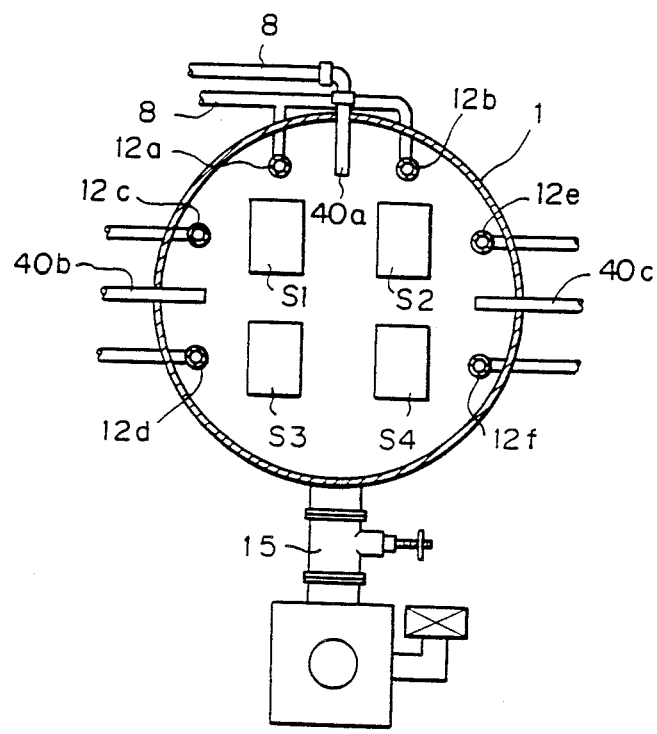
FIG. 34 is an elevational view in section of the essential part of a plasma treatment apparatus provided with shower pipes and straight pipes, embodying the present invention.
Figure 35:
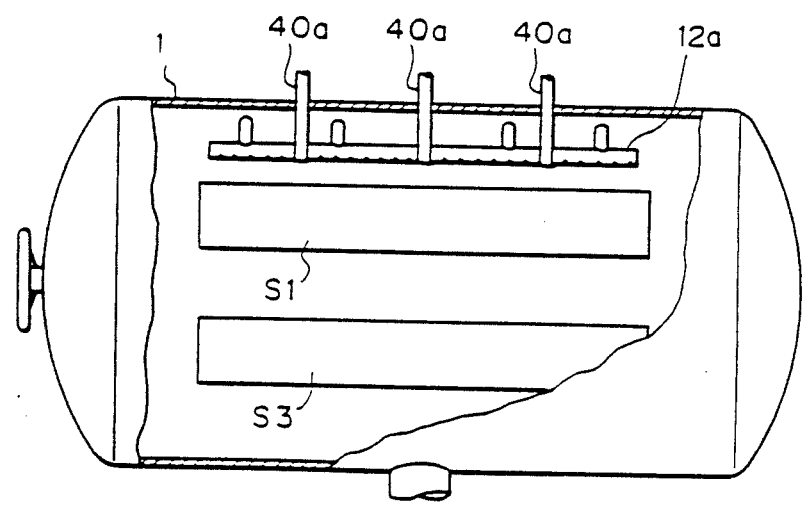
FIG. 35 is a side elevation in section of the essential part of the reaction chamber of the apparatus of FIG. 34.

FIGS. 34 and 35 show a plasma treatment apparatus also embodying this invention, which comprises a plurality of long tubular shower pipes provided along the length thereof with numerous small holes, and at least one straight pipe disposed with its free end opening toward a section to which the plasma can barely flow and the other end connected to the plasma transporting conduit. Referring to FIGS. 34 and 35, a reaction chamber 1 is provided with six plasma-irradiating pipes 12a, 12b, 12c, 12d, 12e and 12f and three sets of straight pipes 40a, 40b and 40c each including three straight pipes. The pipes 12a and 12b are disposed in the upper part of the reaction chamber 1 in parallel to each other and opposite to the upper surface of works S1 and S2 respectively. The pipes 12c and 12d are disposed in the left-hand part of the reaction chamber in parallel to each other and opposite to the side surfaces of the work S1 and a work S3 respectively. The pipes 12e and 12f are disposed in the similar state in the right-hand part of the reaction chamber 1. The straight pipes 40a are tubular members each having a straight portion of a fixed length from the opening end thereof. The straight pipes 40a are interposed with their openings directed toward the center axis of the reaction chamber between the shower pipes 12a and 12b. Three straight pipes 40a are arranged at equal intervals along the longitudinal direction of the shower pipe 12a. Other straight pipes 40b and 40c are also disposed in the same relative position with respect to the corresponding shower pipes 12c, 12d, 12e and 12f as the relative position between the straight pipes 40a and the shower pipes 12a and 12b. The other end opposite the opening end of each straight pipe is connected through a plasma transporting conduit 8 to a plasma generating pipe.

Figure 36:
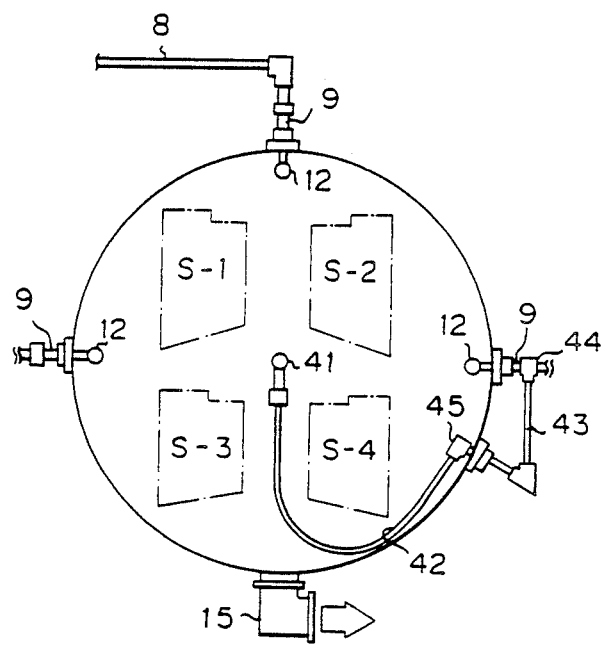
FIG. 36 is a schematic illustration of a plasma treatment apparatus provided with fixed shower pipe and movable shower pipe adapted to be moved to an optional position.
Figure 37:
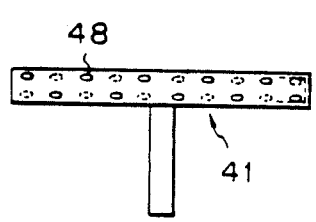
FIGS. 37 and 38 are detail views of a plasma radiating pipe connected to a flexible tube.
Figure 38:
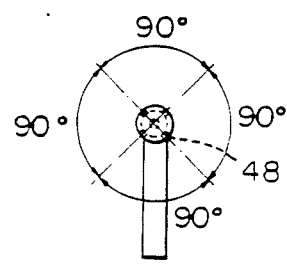
Figure 39:
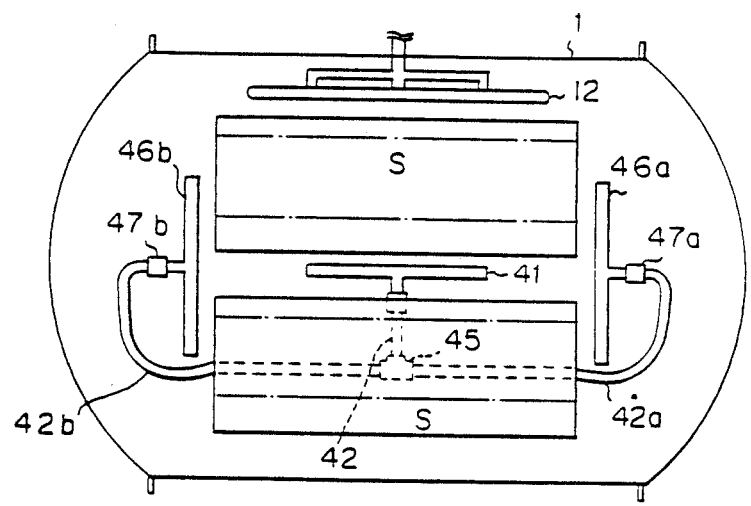
FIG. 39 is a schematic illustration of a further plasma treatment apparatus embodying the present invention, provided with a fixed shower piper and movable shower pipes.

FIG. 36 shows a further embodiment of this invention, in which plasma-irradiating pipes 12 are fixed to the inner wall of a reaction chamber 1, while a plasma-irradiating pipe 41 is connected to a Teflon ® tube 42 so as to be located at an optional position within the reaction chaber 1. In the embodiment of FIG. 36 the pipe 41 is disposed in the central part of the cylindrical reaction chamber 1 along the axial direction of the reaction chamber 1. However, the plasma-irradiating pipe 41 can also be disposed at an optional position or inclination depending on the number, configuration and the arrangement of the works to be treated. The pipe 41 as well as the pipes 12 is made of a quartz glass pipe and is provided with many small holes serving as plasma injection nozzles 48 formed in the circumference of the wall thereof at an equal angular interval of, for example, 90° in order to radiate the plasma in all directions. A plasma transporting conduit 43 for supplying the plasma to the plasma-irradiating pipe 41 is branching off at a fluororesin connector 44. Naturally, the plasma transporting conduit 43 may branch off at any other fluororesin connector and a separate plasma generating system connector and a separate plasma generating system exclusively for the pipe 41 may be provided. Furthermore, in the embodiment of FIG. 36, a single pipe 41 is provided in the central part of the reaction chamber. However, if the works are elongated things which extend axially of the reaction chamber, and if only less effect of the plasma treatment is expected on the longitudinal ends of the works, flexible tubes 42a and 42a which are the same as the flexible tube 42 may be branched from a fluororesin connector 45 and connected to shower pipes 46a and 46b by means of fluororesin connectors 47a and 47b respectively, each shower pipe having plasma injection nozzles only in one side of the wall thereof facing the works in order to irradiate the longitudinal end portions of those works S with the plasma. Such an embodiment is shown in FIG. 39. Referring to FIG. 36, the plasma generated by a plasma generating pipe is supplied through a plasma transporting conduit 8 and fluororesin connectors to the plasma-irradiating pipes 12. Some part of the plasma is branched at a fluororesin connector 44 and is supplied through a plasma transporting conduit 43, a fluororesin connector 45 and the flexible tube 42 to the plasma-irradiating pipe 41. In the embodiment of FIG. 29, the plasma is branched further at the fluororesin connector 45 and supplied through the flexible tubes 42a and 42b and fluororesin connectors 47a and 47b to the pipes 46a and 46b respectively.

In those embodiments of plasma treatment apparatus according to the present invention, the uniform distribution of the plasma density was established within the reaction chamber 1 and even in the plasma treatment of comparatively large works of complicated configuration, uniform plasma treatment over the entire surfaces of the works was attained regardless of the location and the configuration of the works. The adhesion of the paint film to the plasma-treated surfaces was satisfactory with every part of the surfaces after painting process.

Figure 40:
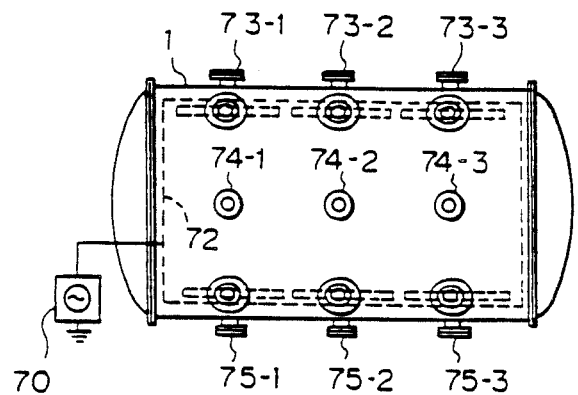
FIG. 40 is a side elevation of a plasma treatment apparatus employing both radio wave discharge plasma and microwave discharge plasma.
Figure 41:
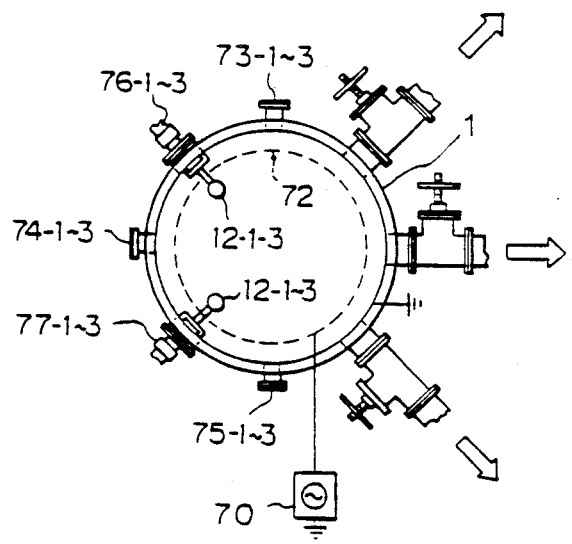
FIG. 41 is a sectional view of the apparatus of FIG. 40.

FIGS. 40 and 41 show further embodiment of this invention, in which a substantially cylindrical electrode 72 is disposed adjacently to the inner wall of a reaction chamber. The electrode 72 is connected to a radio-frequency power source 70. The electrode 72 is formed of a porous plate to allow the plasma to flow into the inside of the reaction chamber 1. Three gas inlet ports 73-1, 73-2 and 73-3 are provided in the wall of the reaction chamber 1 for supplying a gas to be converted into plasma by radio wave discharge. In the wall of the reaction chamber 1, at positions circumferentially corresponding to the gas inlet ports 73-1, 73-2 and 73-3 ad separated by angular intervals of 90° therefrom, three gas inlet ports 74-1, 74-2 and 74-3 and three gas inlet ports 75-1, 75-2 and 75-3 are also provided respectively. Microwave discharge plasma introducing ports 76-1, 76-2 and 76-3, and 77-1, 77-2 and 77-3, are formed between the gas inlet ports 73-1, 73-2 and 73-3, and 74-1, 74-2 and 74-3, and between the gas inlet ports 74-1, 74-2, and 74-3, and 75-1, 75-2 and 75-3, respectively. Those plasma introducing ports 76-1 to -3 and 77-1 to -3 are connected to shower pipes 12-1, 12-2 and 12-3. Radio-frequency energy is generated between the electrode 72 disposed in the reaction chamber 1 and connected to the radio-frequency power source 70 and the grounded reaction chamber 1. While the gas, for example, oxygen gas, is introduced into the reaction chamber through the gas inlet ports 73-1, to -3, 74-1 to -3 and 75-1 to -3, and converted into radio wave discharge plasma by the radio-frequency enerby. The radio wave discharge plasma thus generated functions to plasma-treat the surfaces of works placed adjacently to the electrode 72 disposed in the reaction chamber, namely the general surfaces of the works. The plasma introduced into the reaction chamber 1 through the plasma introducing ports 76-1 to -3 and 77-1 to -3 injected by the plasma-irradiating pipes 12-1 to -3. The plasma functions to plasma-treat the portions of the surfaces which are plasma-treated insufficiently by the radio wave discharge plasma, namely, the portions which are situated far from the electrode 72 disposed in the reaction chamber 1 or the portions which are screened by the works from the radio wave discharge plasma. The plasma treatment of works by means of this embodiment employing both the radio wave and microwave discharge plasmas reduced variation in the effect of plasma treatment between the works and within the individual works. In the experimental plasma treatment using this embodiment, the works were first subjected to radio wave discharge plasma treatment, and then to microwave discharge plasma treatment. However, the same effect would be attainable even if the plasma treatment processes were reversed or both the radio wave and microwave discharge plasma treatment were carried out simultaneously.

We claim:

1. An apparatus for plasma treatment, capable of plasma-treating a plurality of works of resin material by irradiating the surfaces of the works with a microwave discharge plasma within a vacuum reaction chamber having an inner wall, comprising a plasma introducing port formed in the wall of the reaction chamber, a plasma-irradiating pipe connected to the plasma introducing port, said plasma-irradiating pipe being provided with a number of nozzle holes for injecting the plasma into the reaction chamber to form a flow of plasma and to irradiate therewith the surfaces of the works, a discharge port formed in the wall of the reaction chamber to reduce the internal pressure of the reaction chamber, a plurality of deflecting plates projecting from the inner wall of the reaction chamber toward the works centrally disposed within the interior of the reaction chamber, said plurality of deflecting plates being inclined toward the flow of plasma so as to diffuse said flow of plasma toward the works so that a substantially uniform distribution of plasma is provided on the works.

* * * * *